(12) United States Patent
Kim

(10) Patent No.: US 7,542,348 B1
(45) Date of Patent: Jun. 2, 2009

(54) NOR FLASH MEMORY INCLUDING BIPOLAR SEGMENT READ CIRCUIT

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 19 days.

(21) Appl. No.: 11/960,538

(22) Filed: Dec. 19, 2007

(51) Int. Cl.
*G11C 16/06* (2006.01)
*G11C 16/04* (2006.01)
*G11C 7/02* (2006.01)

(52) U.S. Cl. .............. 365/185.21; 365/185.11; 365/208

(58) Field of Classification Search ............. 365/185.21
See application file for complete search history.

(56) References Cited

U.S. PATENT DOCUMENTS

| | | | |
|---|---|---|---|
| 4,237,472 A * | 12/1980 | Hollingsworth | ............. 257/324 |
| 5,371,703 A * | 12/1994 | Miyamoto | ............. 365/185.21 |
| 5,422,854 A * | 6/1995 | Hirano et al. | ............. 365/210.1 |
| 5,862,077 A | 1/1999 | Briner | |
| 5,973,957 A | 10/1999 | Tedrow | |
| 6,888,770 B2 * | 5/2005 | Ikehashi | ..................... 365/205 |

* cited by examiner

*Primary Examiner*—Son L Mai

(57) ABSTRACT

A bipolar segment read circuit is applied for reading NOR flash memory such that cell current is converted to voltage by discharging bit line, which voltage is amplified by the bipolar segment read circuit, and then the voltage difference is converted to time difference by a block read circuit. In this manner, a reference signal is generated by reference cells storing low threshold data, which signal is delayed by a tunable delay circuit for generating a locking signal. Thus the locking signal effectively rejects latching high threshold data in latch circuits because high threshold data is arrived later. Furthermore, by adopting multi-divided bit line architecture, discharging time of bit line is reduced. And the memory cell can be formed from single crystal silicon or thin film polysilicon because the memory cell only drives lightly loaded bit line, even though thin film transistor can flow relatively low current, which realizes multi-stacked memory.

20 Claims, 8 Drawing Sheets

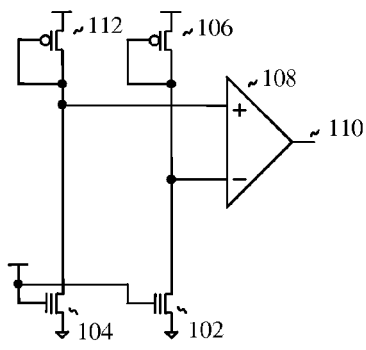
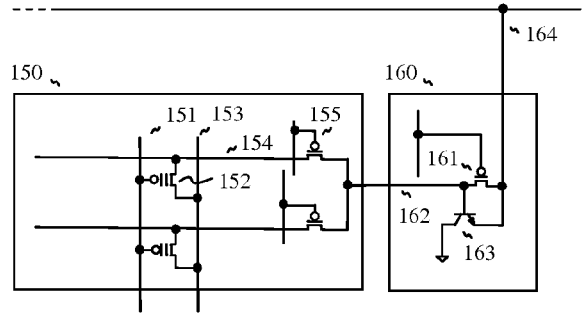
FIG. 1A (Prior Art)
FIG. 1B (Prior Art)
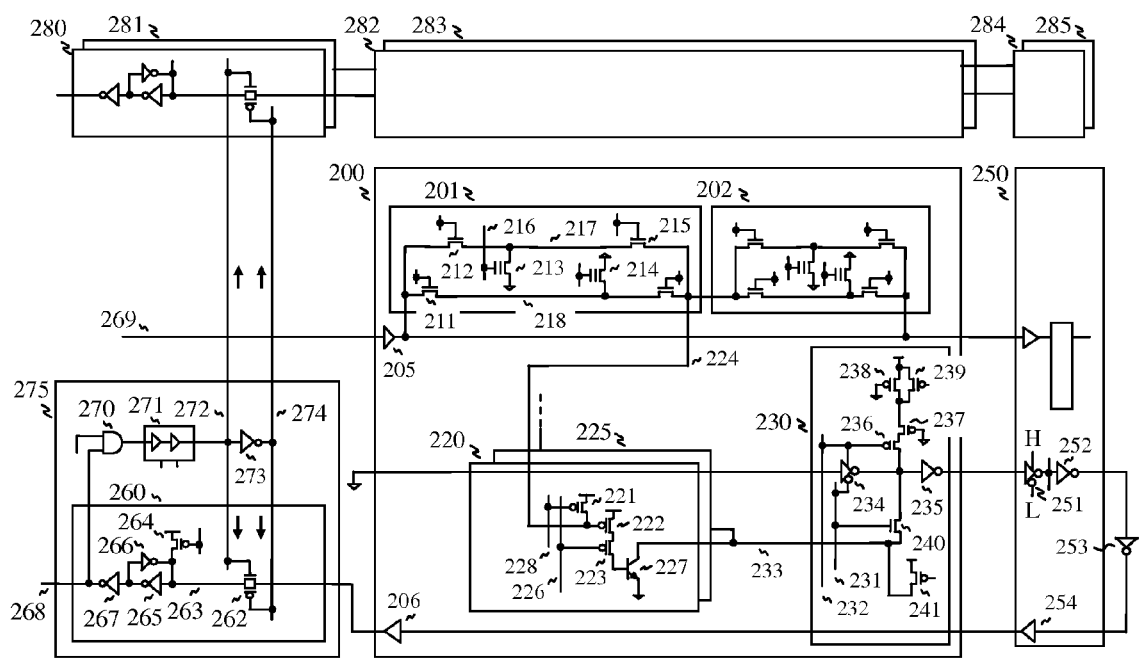
FIG. 2

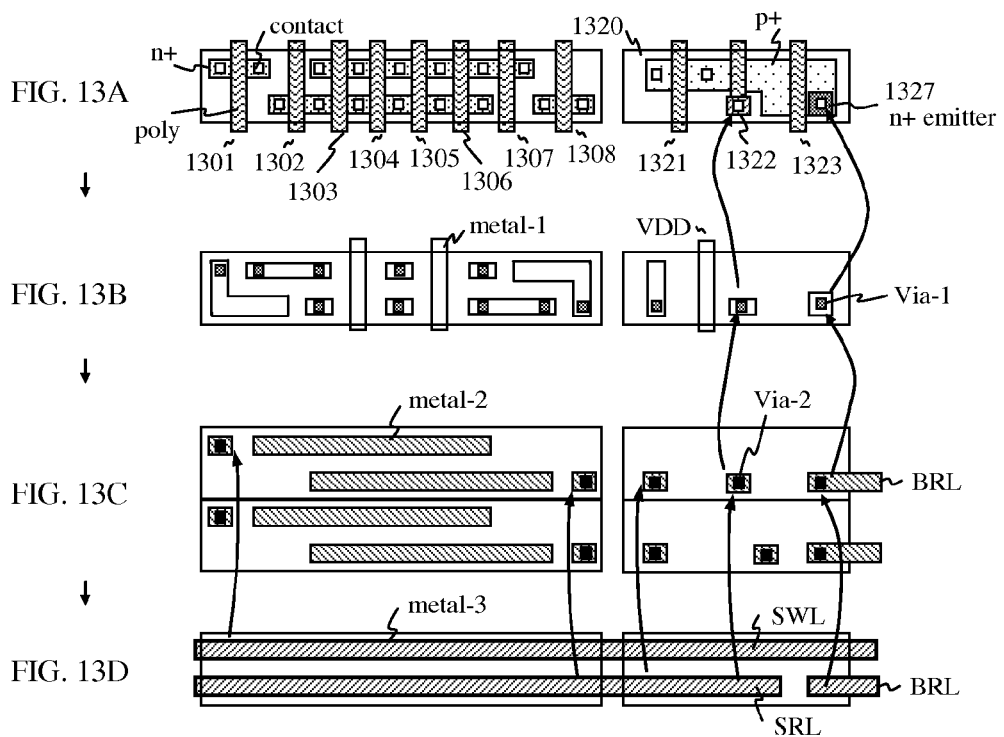
FIG. 13A
FIG. 13B
FIG. 13C
FIG. 13D
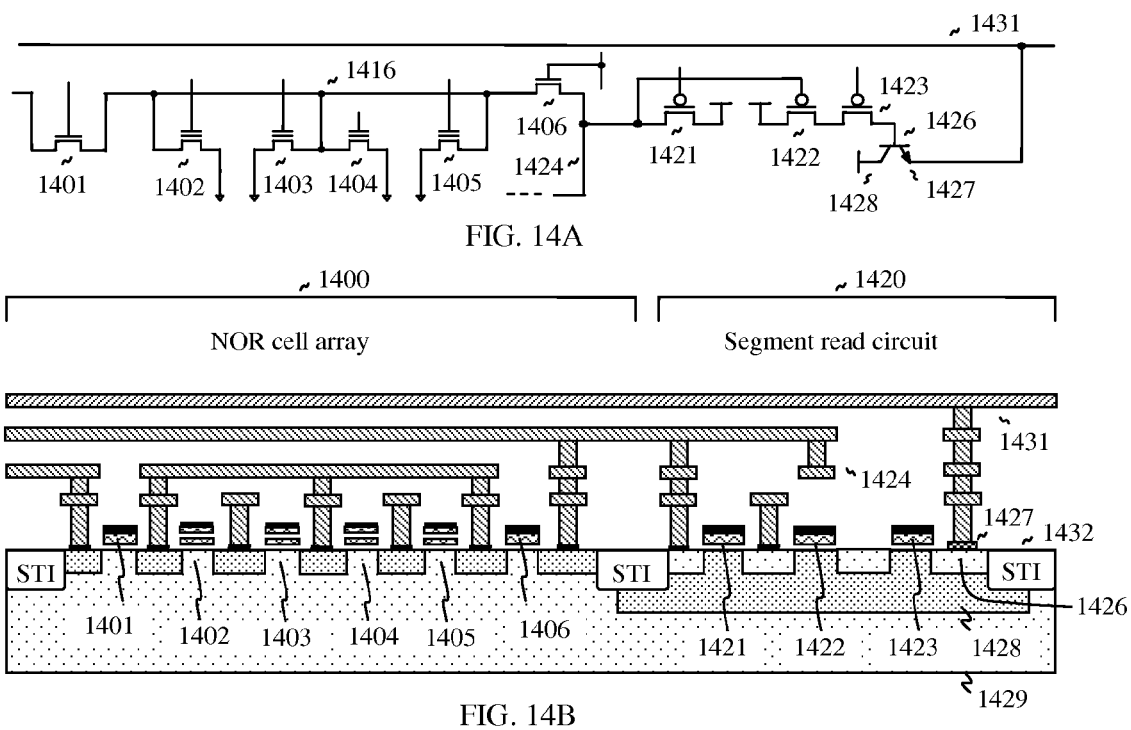
FIG. 14A
FIG. 14B

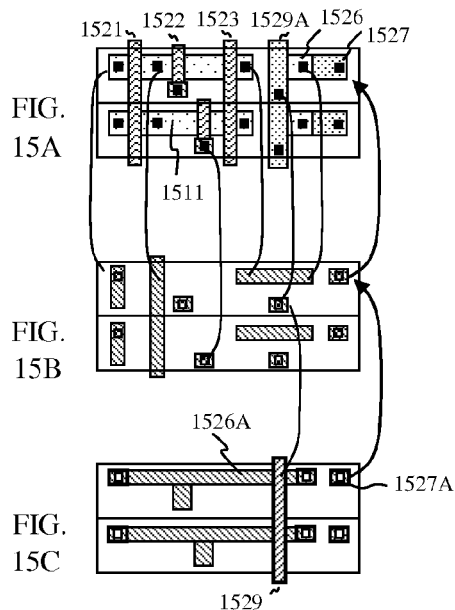
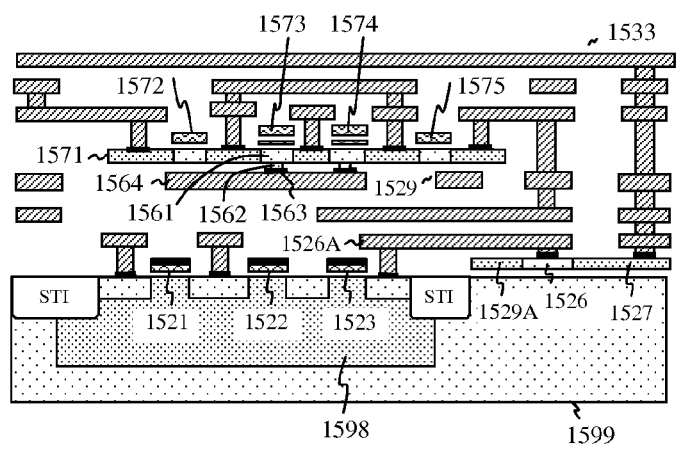
FIG. 15A
FIG. 15B
FIG. 15C
FIG. 15D
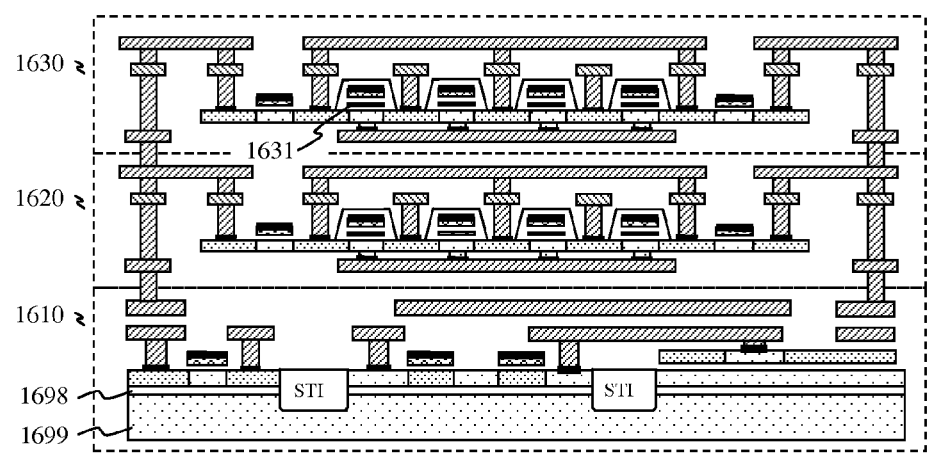
FIG. 16

NOR FLASH MEMORY INCLUDING BIPOLAR SEGMENT READ CIRCUIT

FIELD OF THE INVENTION

The present invention relates generally to integrated circuits, in particular to NOR flash memory including floating gate as a storage element.

BACKGROUND OF THE INVENTION

Floating gate memory device includes a charge trap region, wherein charges are stored in an isolated conductor, commonly referred to as a floating gate, in a field-effect transistor (FET) device. A memory cell operates by storing electric charge (representing either a binary "1" or "0" state of one data bit) on the floating gate, which is incorporated into a MOS (Metal-Oxide Semiconductor) field-effect transistor. The stored charges affect the threshold voltage (VT) of the transistor, thereby providing a way to read the current through the storage device.

A memory cell typically consists of a transistor, a floating gate, and a control gate above the floating gate in a stacked gate structure. The floating gate, typically composed of polycrystalline silicon (i.e., "polysilicon"), is electrically isolated from the underlying semiconductor substrate by a thin dielectric layer, which is typically formed of an insulating oxide, and more particularly, silicon oxide. This dielectric layer is often referred to as a tunnel oxide layer. The control gate is positioned above the floating gate, and is electrically isolated from the floating gate by a storage dielectric layer. Thus, the floating gate serves as a charge trap region, wherein charges are stored in the charge trap region. Other charge storage devices are constructed to store charges in insulator bulk traps in the FET device, such as MNOS (metal-nitride-oxide-semiconductor), MAOS (metal-alumina-oxide-semiconductor), MAS (metal-alumina-semiconductor), and SONOS (silicon-oxide-nitride-oxide-semiconductor) memory cells.

A programmed memory cell has its VT increased by increasing the amount of negative charge stored on the floating gate, i.e., for given source and drain voltages, the control gate voltage which allows a current to flow between the source and the drain of a programmed memory cell is higher than that of a non-programmed memory cell. Therefore, the state of a memory cell is read by applying a control gate voltage below the predetermined level corresponding to the programmed state, but sufficiently high to allow a current between the source and the drain in a non-programmed memory cell. If a current is detected, then the memory cell is read to be not programmed.

The floating gate memory, such as flash memory, can configure very high density memory. Then, the flash memory is applied to the memory of BIOS (basic I/O system) in the computer system, the memory of the communication rule etc. in a portable telephone, and the memory of the image in the digital camera, etc. as substitution of the hard disk drive.

The conventional flash memory is realized by using the sense amp in order to measure the current of the floating gate transistor. In FIG. 1A, one of prior arts for the sense amp is illustrated, as published, U.S. Pat. No. 5,973,957. The function of the sense amplifier 108, or comparator, is to make a comparison of the cell being sensed 102 to a reference cell 104. This comparison is accomplished by passing the cell current through a load device 106 which converts the current to a voltage. The load device 106 is an S-device in one embodiment, but is not so limited; for example, the load device 106 may be a p-channel device having a grounded gate or a resistor. The S-device is a high trans-conductance n-channel transistor that is specially doped to provide a threshold voltage that is lower than the threshold voltage of a standard n-channel CMOS device. For one embodiment, the S-device is doped to have a threshold voltage of approximately 0.3 volts. The sense amplifier 108, or comparator, then compares the threshold voltage Vt 104 from a reference cell to the voltage of the flash cell 102 and provides an output 110 based on the results of the comparison. The load device 112 of the reference cell, for one embodiment, is the same type of device as the load device 106 or the flash cell.

In FIG. 1B, another prior art is illustrated for reading the stored data with bipolar transistor as published, U.S. Pat. No. 5,978,264, wherein a bipolar transistor 163 serves as an amplify device. During read operation, the bipolar transistor amplifies cell current flow of a p-type floating gate memory cell 152, and the emitter and the base of the bipolar transistor 163 are controlled by a PMOS transfer transistor 161, to be shorted. And the base 162 of the bipolar transistor is connected to sub bit line 154 through PMOS transfer transistor 155, the selected memory cell 152 is connected sub bit line, word line 151 is asserted to the memory cell and source line 153 sinks the cell current when low threshold data is stored in the selected memory cell. Thus, the bipolar transistor changes the main bit line 164. Otherwise, the bipolar transistor 163 is floating, because the cell transistor is turned off when read high threshold data. However, the gain is limited because the collector current is amplified by the base current.

The conventional flash memory has progressed its miniaturization and as a result there arises difficulties in obtaining necessary current to measure the stored data in the memory cell. The turn-on current of the cell transistor should drive the selected bit line where the bit line loading is relatively high because multiple memory cells are connected to a bit line. Also unselected memory cells flow leakage current, which discharges the selected bit line. Thus, the ratio between the turn-on current and the turn-off current should be relatively high to differentiate low threshold data and high threshold data, such as several 1000 times different. When the ratio is very low, the comparator can not differentiate low threshold data and high threshold data because the leakage current (turn-off current) also discharge the bit line, which may cause the sensing error.

Furthermore, one of major problem is that the turn-on current through the floating gate MOS transistor is low, around 10 uA or less for the conventional flash memory, as published, "New Self-Adjusted Dynamic Source Multilevel P-Channel Flash Memory", IEEE Transactions Electron Devices", Vol. 47 No. 4 pp. 841-847, April 2000. Even worse in the other types of floating gate memory, such as the nanocrystal memory, the drain current of the memory cell is around 1 nA or less, as published, "Metal Nanocrystal Memories—Part II: Electrical Characteristics", IEEE Transactions on Electron Devices, Vol. 49, No. 9, September, 2002. And for the single electron memory (SEM) including quantum dot, the drain current is 1.5 p~3 pA as published, "Room temperature Coulomb oscillation and memory effect for single electron memory made by pulse-mode AFM nano-oxidation process", 0-7803-4774-9/98 16.6.2 IEDM 1998.

In this respect, there is still a need to improve the floating gate memory, in order to read the cell transistor more effectively, even though the cell transistor can flow relatively low current. In the present invention, multi-divided bit line architecture is introduced to reduce the parasitic capacitance of the bit line, and a segment read circuit is added for the multi-divided local bit line. And one more major improvement is that a time-domain sensing scheme is introduced in order to differentiate low threshold data and high threshold data.

And, the memory cell can be formed from single crystal silicon on the surface of a wafer. Alternatively, the memory cell can be formed from thin film polysilicon layer, because the lightly loaded bit line can be quickly discharged by the cell transistor even tough the thin film cell transistor can flow relatively low current. In doing so, multi-stacked NOR flash memory is realized with thin film cell transistor, which can increase the density of the flash memory within the conventional CMOS process with additional process steps, because the conventional planar CMOS process is reached to the scaling limit for fabricating cell transistors on the surface of the wafer.

SUMMARY OF THE INVENTION

In the present invention, NOR flash memory including bipolar read circuit is described. By introducing multi-divided bit line architecture, bit line loading is reduced. Thus, the bit line is quickly discharged by a selected cell transistor. In particular, a bipolar segment read circuit is added to amplify the bit line voltage in order to obtain higher gain, which realizes to read the cell transistor more effectively, even though the cell transistor can flow relatively low current. The bipolar segment read circuit is composed of a few MOS transistors and a bipolar transistor, in order to insert within the memory cell array repeatedly. And, the cell transistor can be formed from single crystal silicon or thin film polycrystalline silicon because the lightly load bit line can be driven by the cell transistor even though the cell transistor can flow relatively low current, which also realizes multi-stacked flash memory with low temperature polycrystalline silicon. With low temperature process, routing metal layers and cell transistors in the bottom are not affected when processing the upper cell transistors. Furthermore, the cell transistor can be miniaturized further. As a result, the present invention can overcome the scaling limit of the conventional planar CMOS process. There are almost no limits to stack multiple memory cells as long as the flatness is enough to accumulate the transistors.

Furthermore, the bipolar segment read circuit serves as an amplify device while a block read circuit serves as a load device, and which circuits configure an amplifier. And then, the block read circuit detects the data and transfers the read data to the latch circuit through a read path. In particular, time-domain sensing scheme is introduced to differentiate low threshold data and high threshold data, such that a reference signal is generated by reference cells storing low threshold data, which signal serves as a locking signal for the latch circuit in order to reject latching the high threshold data because high threshold data is arrived after the low threshold data is arrived. This means that the arriving time reflects the cell current between low threshold data and high threshold data.

The read path has no phase control signals. After released from the pre-charge state by pre-charge signal, the bit line waits until a cell transistor is turned on by raising a word line and a select line. When low threshold data is selected, the cell transistor is turned on and the bit line is discharged by turn-on current of the cell transistor because the threshold voltage of the cell transistor is low. Otherwise, the bit line keeps the pre-charge state when high threshold data is selected. However, the leakage current (or turn-off current) of high threshold cell transistor discharges the selected bit line very slowly. Since low threshold data quickly discharges the selected bit line, low threshold data generates a reference signal, which is used to a locking signal for the time-domain sensing scheme. In doing so, the locking signal rejects latching high threshold data to a latch circuit, in order to differentiate low threshold data and high threshold data. Thus, low threshold data changes the latch output, while high threshold data does not change the latch output from the pre-charge state.

And a delay circuit is added for generating the locking signal from the reference signal because there is a need for adding predetermined delay time before locking the latch circuit with the statistical data for all the memory cells such as mean time between low threshold data and high threshold, in order to compensate cell-to-cell variations. Thereby the delay circuit generates a delay for optimum range of locking time, which circuit is tunable. The read output from the cell transistor is transferred to the latch circuit through a returning read path, thus the access time of the cell transistor is equal regardless of the location of the cell transistor, which is advantageous to transfer the read output to the external pad at a time.

The time-domain sensing scheme effectively differentiate low threshold data and high threshold data with time delay control, while the conventional sensing scheme is current-domain or voltage-domain sensing scheme. In the convention memory, the cell current is converted to voltage, and the voltage is compared by a comparator or an inverter, so that there is not much choice to control the comparator with existing circuits, because current and voltage are directly related to the process parameters. Now in the present invention, there is one more converting step to read the data, such that the current of the cell transistor discharges the bit line, the segment read circuit detects the voltage of the bit line, and the voltage data is converted to time difference by the block read circuit. Furthermore, the block read circuit is tunable to differentiate low threshold data and high threshold data more effectively. As a result, the read output of the block read circuit is reached to the latch circuit through the returning data path. In doing so, the low threshold data is reached to the latch circuit earlier, while high threshold data is rejected by the locking signal. There are many advantages to adopt the time-domain sensing scheme, so that the sensing time is easily controlled by the tunable delay circuit, which compensates wafer-to-wafer variation as well. Furthermore, this circuit technique is also useful for small cell transistors, such as nanocrystal memory and single electron memory including quantum dot, because small cell transistors can flow very low current. Moreover, the bit line can be divided into a small piece for reducing parasitic capacitance of the bit line, which enables the time-domain sensing scheme can differentiate very low current difference with lightly loaded bit line.

One more advantage is that the time-domain sensing scheme is useful for reducing the cell current difference between the turn-on current of the low threshold data and the turn-off current of the high threshold current. In the conventional flash memory, there is at least several 1000 times difference between the turn-on current and the turn-off current, in order to read the cell transistor with existing comparator or an inverter. In the present invention, the current difference can be reduced, for example, to several 100 times instead of several 1000 times, as long as the distribution of the difference is stable at a given fabrication process for manufacturing.

Still furthermore, any type of floating gate device can be used as a storage device, such as MNOS (Metal-Nitride-Oxide Semiconductor), SONOS (Silicon-Oxide-Nitride-Oxide Semiconductor), MAOS (metal-alumina-oxide-semiconductor), MAS (metal-alumina-semiconductor), nanocrytal memory including nanocrystal layer, single electron memory including quantum dot, and so on.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 1A illustrates a sensing circuit for NOR flash memory as a prior art. And FIG. 1B illustrates another sensing circuit for NOR flash memory as a prior art.

FIG. 2 illustrates the time-domain sensing scheme including multi-divided bit line architecture, according to the teachings of the present invention.

FIGS. 13A, 13B, 13C and 13D illustrate example layouts for the memory cell array and the bipolar segment read circuit, according to the teachings of the present invention.

FIG. 14A illustrates a related circuit schematic for explaining a cross sectional view. FIG. 14B illustrates a cross sectional view for the bipolar segment read circuit and the memory cell array, according to the teachings of the present invention FIGS. 15A, 15B and 15C illustrate an example layout including the bipolar segment read circuit, and FIG. 15D illustrates a cross sectional view, according to the teachings of the present invention.

FIG. 16 illustrates a cross sectional view for the multi-stacked memory cell array including the bipolar segment read circuit, according to the teachings of the present invention.

DETAILED DESCRIPTION OF PREFERRED EMBODIMENT(S)

Figure 3A:
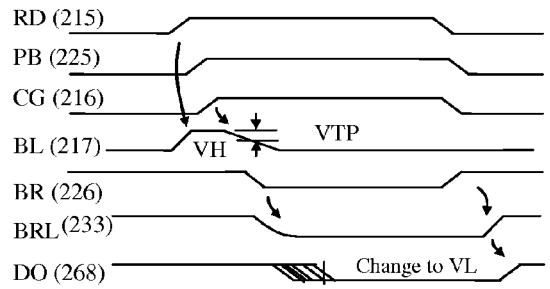
FIG. 3A illustrates read timing diagram for low threshold cell transistor.

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

The present invention is directed to NOR flash memory including bipolar segment read circuit, as shown in FIG. 2, wherein a memory block 200 is composed of multiple memory cell arrays 201 and 202, bipolar segment read circuits 220 and 225, a write buffer 205, a read buffer 206 and a block read circuit 230. The write buffer 205 receives data input 269, and the read buffer 206 receives read output from cell transistor through read path including inverters 251, 252, 253 and non-inverting buffer 254. The memory cell arrays 201 and 202 are connected to the bipolar segment read circuit 220 to read the stored data. The memory cell array 201 comprises a write select transistor 212, a read select transistor 215, and cell transistors (memory cell) 213 and 214. The cell transistors 213 and 214 are connected to a local bit line 217. The write select transistor 212 is connected to the write buffer 205. A segment read line 224 is connected to the bipolar segment read circuit 220 wherein a read transistor 222 receives the segment read line 224, a (column) select transistor 223 is serially connected to the read transistor 222, a pre-charge transistor 221 is connected to the segment read line 224, an n-p-n bipolar transistor 227 receives output of the series connection including the read transistor 222 and the select transistor 223, the pre-charge transistor 221 is controlled by pre-charge control signal 228, and the select transistor 223 is controlled by column select signal 226, so that the bipolar transistor 227 serves as an amplify device for configuring an amplifier with a load device in the block read circuit 230. Hence the bipolar amplify transistor 227 is connected to a block read line 233 in order to set up a current path to the block read circuit 230. While the lightly loaded segment read line 224 with multi-divided bit line architecture is driven by a cell transistor, the heavily loaded block read line 233 with long line is driven by the bipolar segment read circuit 220 which is much stronger than the cell transistor. Thus bipolar amplify transistor 227 strongly and quickly discharges the block read line when reading low threshold data. More specifically, in order to read data, the local bit line 217 is pre-charged by the pre-charge transistor 221 through the read select transistor 215. After the selected local bit line 217 is pre-charged, the pre-charge transistor 221 is turned off to release the local bit line. Then, control gate 216 (word line) of the selected memory cell is raised to predetermined voltage to measure the stored data in the charge trap region of the selected memory cell. Thus, the segment read line 224 is discharged by the cell transistor when the low threshold data is stored in the charge trap region of a selected cell transistor. Otherwise the segment read line 224 is not discharged by the cell transistor when the high threshold data is stored. When the memory block 200 is selected, tri-state inverter 234 in the block read circuit 230 is turned off by the block selector signal 231 (high) and 232 (low), while the tri-state inverter 251 in the unselected block 250 is turned on in order to bypass the read output. Simultaneously, the pull-up transistors 236, 237, and 238 are turned on for the selected block, but the pull-up strength is much weaker than the pull-down strength of the bipolar segment read circuit 220, where the tunable pull-up transistor 238 is selected by transistor 239. For example, the pull-up strength is one-tenth of the pull-down strength in order to obtain high gain. As a result, the block read line 233 is pulled down near ground voltage from supply voltage where the block read line 233 was pre-charged to supply voltage by pre-charge transistor 241 before a memory cell is turned on, thus output of read buffer 235 is changed to high by the block read line 233, and the read output is transferred to next block 250, which is read data "0" for reading low threshold data, but the output of the read buffer 235 keeps low when reading data "1" from high threshold data because the segment read line 224 keeps pre-charge state, which does not turn on the PMOS read transistor 222, so that n-p-n bipolar transistor 227 keeps off state. Thus the block read line 233 remains at high with the weak pull-up transistors 236, 237, and 238.

And then, the read output from the cell transistor is transferred to a latch circuit 260 through a read path including the read inverter 235, tri-state inverter 251, inverters 252 and 253, and buffers 254 and 206. In particular, the read path includes a returning path, so that the arriving time to the latch circuit is almost same regardless of location of the selected cell transistor, as long as the word line receives the address inputs from the latch circuit side and delay time of the address inputs include similar to the read path including multiple buffers (not shown). Furthermore, the returning path is inverted by inverter 253 which compensates the strength of the rise time and the fall time of the buffers. Without inverting, the long read path includes only rising delay, because the rise time and the fall time are not equal in CMOS buffer.

In the latch circuit 260, the read output changes the latch node 263 and output 268 to low from high through inverters 265 and 267 because the latch node 263 is pre-charged to high by PMOS 264 before activated. After then, the read output is stored in the latch node 263 with cross coupled inverters 265 and 266. And the output 268 changes AND gate 270 to low, so that the transmission gate 262 is locked by signal 272 and 274 which are transferred from the output 268 through a tunable delay circuit 271 and inverter 273. Simultaneously, latch circuits 280 and 281 are also locked by the signal 272 and 274, where latch circuits 280 and 281 are composed of same circuits as the latch circuit 260. In doing so, the output 268 serves as a reference signal, which is generated by the reference memory cells, such as the cell transistors 213 and 214 which store low threshold data. Adding delay circuit 271, the reference signal serves as a locking signal, where the delay circuit is tunable for differentiating low threshold data and high threshold data, more effectively. Thus, the latch circuit and the delay circuit configure a latch control circuit 275 in order to generate the locking signal. More detailed delay circuit will be explained as below. And the AND gate 270 is used to generate the reference signal even though one of reference cells is failed, where more than one reference column is added to the memory block even though the drawing illustrates only one reference memory column 200 including the latch circuit 260. In this manner, the read outputs from the main memory array 282, 283, 284 and 285 are stored to the latch circuit 280 and 281 by the locking signals 272 and 274. Furthermore, the read access time is faster than that of the conventional floating gate memory, such that multi-divided bit line architecture is introduced in order to reduce the parasitic capacitance of local bit line, and number of cells in a local bit line can be also decreased to reduce parasitic capacitance.

Referring now to FIG. 3A in view of FIG. 2, detailed timing diagram for reading low threshold data is illustrated. To read data, the read transfer transistor (RD) 215 is asserted to high, thus the selected local bit line 217 is pre-charged to supply voltage (VH) by the pre-charge transistor 221. After pre-charging, the pre-charge bar (PB) signal 228 is raised to turn off the pre-charge transistor 221 in order to release the local bit line 217 and the segment read line (SRL) 224, and then the control gate (CG) signal 216 is raised to predetermined voltage to measure the selected cell transistor 213, while unselected cell transistor 214 and write select transistor 212 keep turn-off state. After then, the block read (BR) signal 226 is lowered to turn on the segment select transistor 223. Hence the segment read line 224 is discharged through the cell transistor 213 when low threshold data is stored in the charge trap region. Discharging the segment read line (SRL) 224 to threshold voltage (VTP) of PMOS read transistor 222, the read transistor 222 and the select transistor 223 set up a current path through base of bipolar transistor 227, so that the block read line (BRL) 233 is pulled down near ground voltage, because the bipolar transistor 227 is much stronger than the pull-up transistors 236, 237 and 238, while block select transistors 236 and 240 are turned on but tri-state inverter 234 and pre-charge transistor 241 are turned off. Using bipolar transistor as an amplify device, there are many advantages, such that bipolar transistor can flow more current than MOS transistor because bipolar transistor set ups current path through the whole junction while MOS transistor sets up the current path through shallow inversion channel region only.

Pulling up the block read line 233, the output of read buffer 235 is changed to low from high, and which output is transferred to output node (DO) 268 through the returning read path including inverting buffers 251, 252 and 253, and non-inverting buffers 254 and 206. During read operation, there is no phase control signal such that the cell data is immediately transferred to the output node 268 through the read path. Hence, read control is relatively simple, which also realizes fast access with lightly loaded bit line. Furthermore, the segment read transistor 222 can include lower threshold voltage MOS transistor than that of other peripheral circuits, in order to achieve fast discharging the segment read line. After reading the data, the pre-charge bar (PB) signal 228, the control gates 217, and other control signals are returned to pre-charge state or standby mode.

Figure 3B:
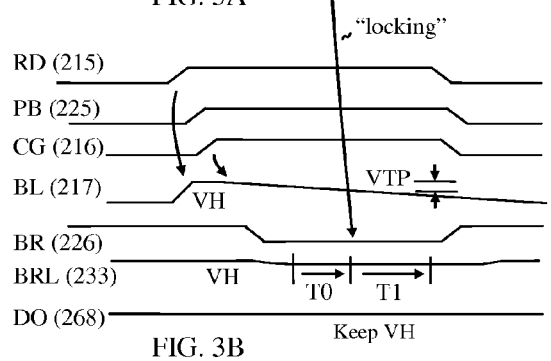
FIG. 3B illustrates read timing diagram for high threshold cell transistor, according to the teachings of the present invention.

Referring now to FIG. 3B in view of FIG. 2, detailed timing diagram for reading high threshold data is illustrated, wherein the transistors 222 and 223 in the bipolar segment read circuit do not pull up the base of the bipolar amplify transistor 227, which does not pull down the block read line 233 because the segment read line (SRL) 224 is not discharged by the cell transistor when the high threshold data is stored in the charge trap region. Thereby, the block read line 233 keeps high with weak pull-up transistors 236, 237 and 238, thus the output (DO) 268 keeps high. However, the segment read line (SRL) 224 is slowly discharged by the turn-off current of the cell transistor 213 and other leakages. When the segment read line 224 is reached to the threshold voltage (VTP) of the PMOS transistor 222 by the leakages, the PMOS transistor 222 starts to turn on and pulls up the base of bipolar amplify transistor 227, which gradually pulls down the block read line 233.

Hence, the block read line 233 changes the read buffer 235. As a result the read output (DO) 268 is flipped to low. In order to avoid the false flip with the leakage current, the pull-up strength can be adjusted by selecting the transistors 239. And the reference signal is generated by low threshold data with delay time as shown T0, so that the timing margin T1 is defined to reject the high threshold data. In this manner, the time-domain sensing scheme can differentiate the low threshold data and high threshold data within the time domain. This is obvious that the discharge current "i" through the segment read line is defined as i=Cdv/dt, which is converted to dt=Cdv/i. Thereby, the discharge time "dt" is proportional to the discharge current inversely where the segment read line capacitance "C" and the discharge voltage "dv" are fixed to turn on the segment read transistor 222, which means that the discharge current is converted to discharge time through the bipolar segment read circuit and the block read circuit. Hence the current difference between turn-on current (Ion) and turn-off current (Ioff) is directly converted to time difference. And the reference signal is used to generate a locking signal to sense high threshold data in the time domain.

Figure 4A:
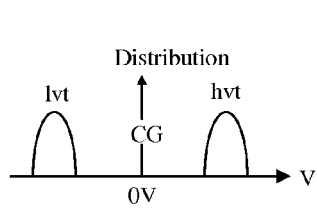
FIG. 4A illustrates a distribution graph for binary level cell transistors.
Figure 4B:
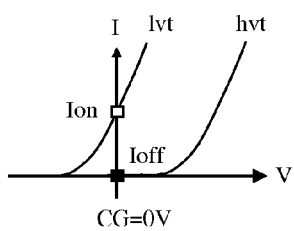
FIG. 4B illustrates I-V curve of the binary level cell transistor.
Figure 4C:
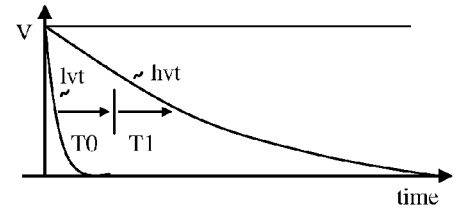
FIG. 4C illustrates discharge times for low threshold data and high threshold data.
Figure 4D:
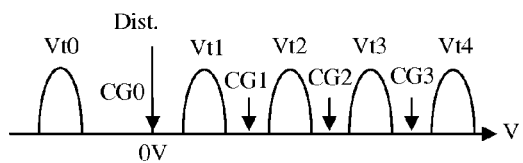
FIG. 4D illustrates a distribution graph of the multi-level cell transistors, according to the teachings of the present invention.

In FIG. 4A, a distribution graph for binary level cell transistor is illustrated, wherein the distribution of the low threshold data of the cell transistor "lvt" is lower than that of the high threshold data of the cell transistor "hvt". Hence, the current flow of the "lvt" cell transistor "Ion" is higher than that of the "hvt" cell transistor "Ioff" at a given control gate voltage (CG=0V), as shown in FIG. 4B. And in FIG. 4C, discharge times of the segment read line for low threshold data and high threshold data are illustrated, such that discharge time of high threshold data is defined as T0+T1. Thereby, the best locking time is regarded as T0, only if T0 is around middle between low threshold data and high threshold data in the discharge time. However, it is not necessary that T0 is middle when the "Ioff" current is very low. Thus, the delay time T0 should be optimized after collecting statistical data of the distribution of the cell transistors. In FIG. 4D, a distribution graph of the multi-level cell transistor is illustrated, wherein the threshold voltage Vt0, Vt1, Vt2, Vt3, and Vt4 are defined for storing four-level data, and the control gate voltage CG0, CG1, CG2, and CG3 are forced in order to measure each level of data, respectively.

Figure 5:
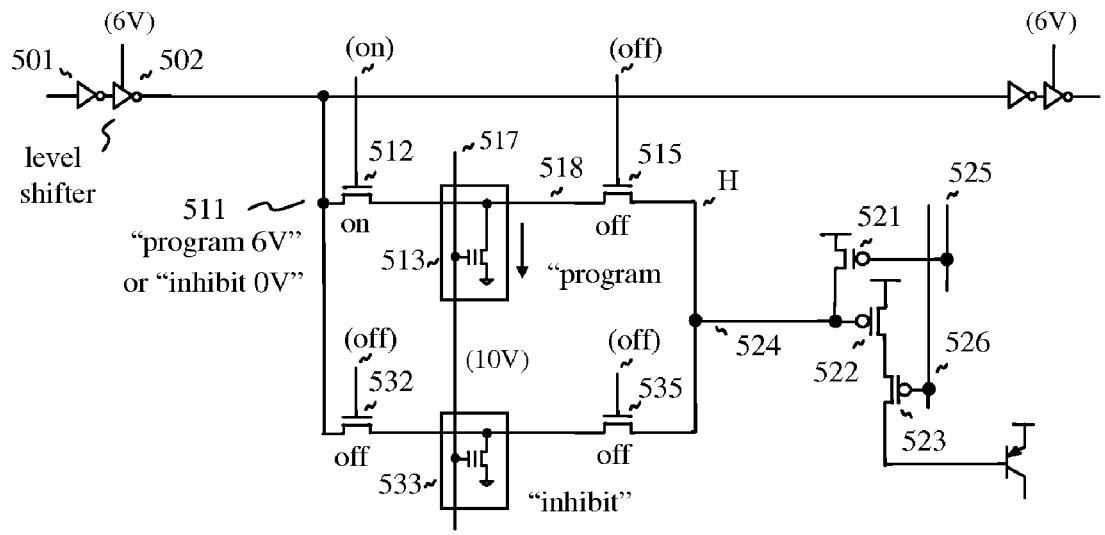
FIG. 5 illustrates a circuit schematic for programming, according to the teachings of the present invention.

In FIG. 5, a simplified circuit schematic for programming the NOR flash memory is illustrated, In order to program the cell transistor (to store high threshold data), the write buffer (501 and 502, 551 and 552) is activated, which buffer drives the segment write line 511 to high (for example, 6V), the write select transistor 512 is turned on and control gate 517 of the selected cell transistor 513 is selected by forcing a predetermined program voltage (for example, 10V) while gates of the unselected cell transistors (not shown) are forced to lower voltage (for example, 0V). During program, the read select transistor 515 and 535 are turned off to cut the current path, thus another unselected cell transistor 533 is not programmed, so that the unselected write select transistor 532 is turned off. During program, the segment read circuit keeps the pre-charge state. Hence the segment read transistor 522 is turned off because pre-charge transistor 521 pre-charges the segment read line 524 to high by asserting the pre-charge control signal 525 to low, and the segment selector transistor 523 is turned off by maintaining the segment selector signal 526 to high. On the contrary, to inhibit programming the selected cell transistor (to keep low threshold data), the write buffer 502 keeps low. Thus, the selected cell transistor 513 keeps low threshold data. The write buffer includes an inverter 501 and an inverting level shifter 502 transfers write voltage, for example, 6V, wherein the level shifter circuit uses conventional level shifter as published, "High-Voltage Transistor Scaling Circuit Techniques for High-Density Negative-Gate Channel-Erasing NOR Flash Memories", IEEE Journal of Solid-States Circuits, Vol. 37, No. 10, pp 1318, October 2002. Hence, the level shifter circuit is not described in the present invention. Additionally, there are various programming methods to store the charges in the charge trap region even though only one method is described herein for simplifying the description. And programming voltage may be changed as well.

Figure 6:
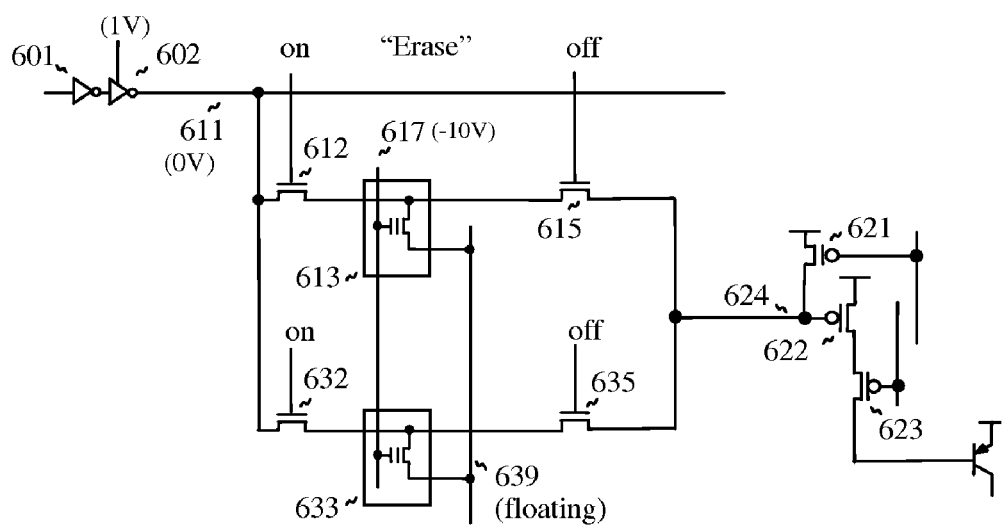
FIG. 6 illustrates a circuit schematic for erasing, according to the teachings of the present invention.

In FIG. 6, a simplified circuit schematic for erasing the NOR flash memory is illustrated. The segment write line 611 is forced to ground by the write buffer including inverter 601 and inverting level shifter 602. During erase operation, the segment read line 624 is pre-charged to high by turning on the pre-charge transistor 621. The gate voltage 617 of the cell transistors 613 and 633 is forced to negative voltage (for example, −10V), the write selector signals 621 and 632 are turned on, but the read select transistors 615 and 635 are turned off. And the source line 639 of the cell transistor is floating during erase. Thereby, the circuit can use the conventional programming and erasing methods as published, U.S. Pat. No. 6,937,948, and "Effect of Fowler Nordheim Tunneling Stress vs. Channel Hot Electron Stress on Data Retention Characteristics of Floating Gate Non-Volatile Memories", IEEE 02CH37320 40TH Annual International Reliability Physics Symposium. Dallas, Tex., 2002.

Figure 7:
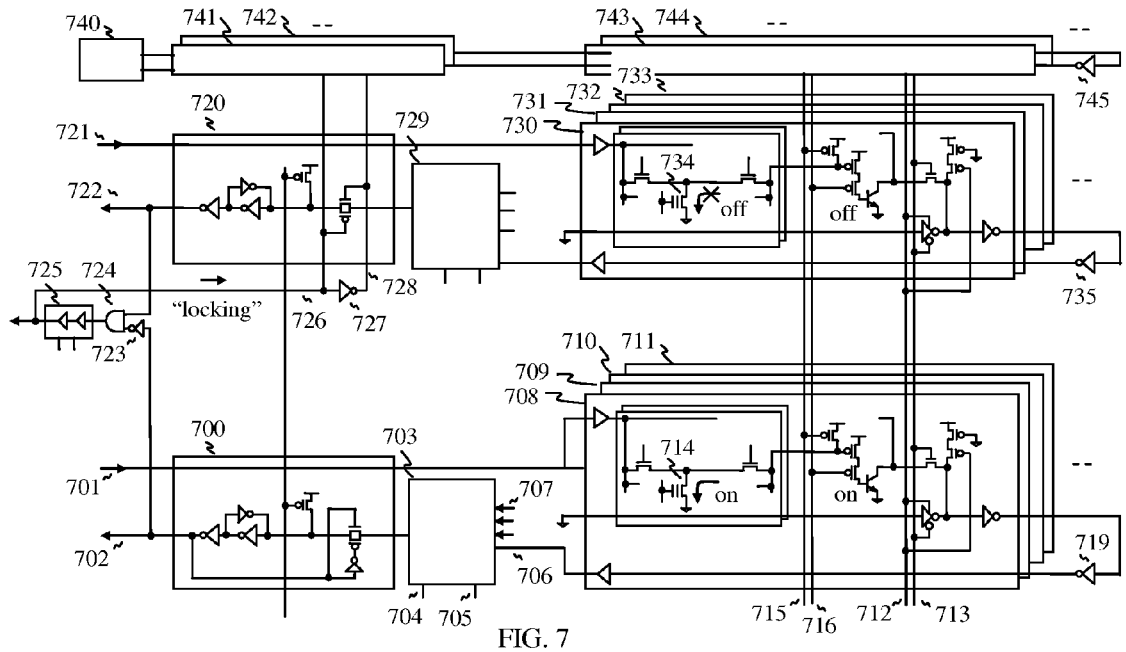
FIG. 7 illustrates a circuit schematic for reading multi-level cell transistor, according to the teachings of the present invention.

In FIG. 7, a circuit schematic for reading multi-level cell transistor is illustrated. In order to read multi-level data from the cell transistor, multiple reference signals are used to measure each level, wherein the memory cell 714 in the memory block 708 stores the first threshold data (Vt0 in FIG. 4D), the memory cells in the memory block 709 stores the second threshold data (Vt1), the memory cells in the memory block 710 stores the third threshold data (Vt2), the memory cells in the memory block 711 stores the fourth threshold data (Vt3), in order to measure four level threshold data. More levels can be measured only if more reference signals are generated by each reference cell storing the related threshold data, even though the drawing depicts only four memory blocks for measuring four levels. When the first level is measured, the first reference signal is selected by the block selector signals 712 and 713, and pre-charge signal 715 and column select signal 716 are also asserted. And, selected cell transistor 714 is turned on, which output (high) is transferred to output 702 of the latch 700 through the selector circuit 703, an inverter 719 and buffer. When the memory block 708 is selected, the selector circuit 703 selects the output 706 with the selector input 704 and 705, where more detailed operation of the selector circuit 703 will be explained as below in FIG. 8D. Thus, the output 706 from the memory block 708 is bypassed the selector circuit 703 and reached to the latch circuit 700. In doing so, the output 706 changes the latch output 702, which signal locks the latch (700) itself. And then the output 702 changes the locking signal 726 through an inverter 723, AND gate 724 and a tunable delay circuit 725, so that other latches 720, 741 and 742 are locked by the locking signals 726 and 728 (inverted signal of 726 with inverter 727). While first threshold cell transistor 714 generates a reference signal, cell transistor 734 storing the second threshold data (Vt1) in the memory block 730 is turned off. Hence, inverter 735 keeps low and the output 722 keeps high.

One aspect of using two reference cells for generating a reference signal is that the reference signal can be used for characterizing the relation between the first threshold data (in the cell 714) and the second threshold data (in the cell 734). Thereby the AND gate 724 always compares the output data from low threshold data and high threshold data. As a result, the locking signal 726 is generated only if two reference cells generate each signal correctly. Otherwise, the locking is not generated. For example, the second threshold (Vt1) cell transistor 734 stores negative charges in the charge trap region, which cell transistor usually turned off when reading the first threshold data (Vt0). However, the cell transistor 734 may be turned on if the stored charges in the charge trap region are reduced after frequent access. And the first threshold cell transistor 714 is usually turned on when reading, but the cell transistor may be turned off if some charges are trapped in the charge trap region after frequent access. In either case, the locking signal 726 is not generated. By measuring the locking signal or reference signal, the system can check whether the memory block works correctly or not.

For measuring the second level, the memory block 709 and 731 are selected during next cycle, such that the second voltage level (CG1) is asserted to the memory block 709, and the third voltage level (CG2) is asserted to the memory block 731 where the memory block 709 stores the second threshold data (Vt1) and the memory block 731 stores the third threshold data (Vt2). Thus, the locking signal 726 is generated as long as the cell transistors work correctly. And the selector circuits 703 and 729 select the signals from the memory block 709 and 731, respectively. In the similar manner, the third level is measured by the memory block 710 (storing the third threshold data) and the memory block 732 (storing the fourth threshold data). And the fourth level is measured by the memory block 711 (storing the fourth threshold data) and the memory block 733 (storing the fifth threshold data), consecutively. Thus, the main memory blocks 743 and 744 are measured by using the locking signals for each level, respectively. And the output data is transferred to the latch circuits 741 and 742 through inverter 745. The latched output is shifted to shifter register 740, where the shifter register 740 is composed of conventional flip-flop circuits. Hence, the detailed schematic is not illustrated in the present invention.

Figure 8A:
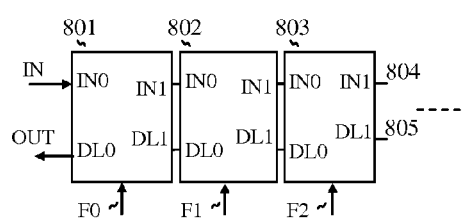
FIG. 8A illustrates a tunable delay circuit.

In FIG. 8A, more detailed tunable delay circuit as shown 725 in FIG. 7 is illustrated, wherein multiple delay units 801, 802 and 803 are connected serially, the first delay unit 801 receives input IN and generates output OUT, the second delay unit 802 is connected to the first delay unit, and the third delay unit 803 is connected to the second delay unit 802 and generates outputs 804 and 805, and so on. Each delay unit receives a fuse signal, such that the first delay unit receives F0, the second delay unit receives F1, and the third delay unit receives F2. And more detailed delay unit is illustrated in FIG. 8B, wherein the delay unit 810 receives an input IN0 and a fuse signal Fi, thus the fuse signal Fi selects output from the input IN0 or input DL1, so that a transfer gate 811 is turned on when the fuse signal Fi is low and output of inverter 813 is high, otherwise another transfer gate 812 is turned on when the fuse signal Fi is high and output of inverter 813 is low to bypass DL1 signal. Inverter chain 814 and 815 delays IN0 signal for the next delay unit, where more inverter chains or capacitors can be added for the delay even though the drawing illustrates only two inverters.

Figure 8C:
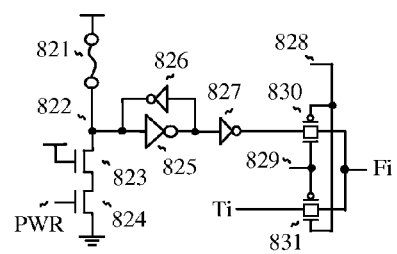
FIG. 8C illustrates a related fuse circuit of the tunable delay circuit.
Figure 8B:
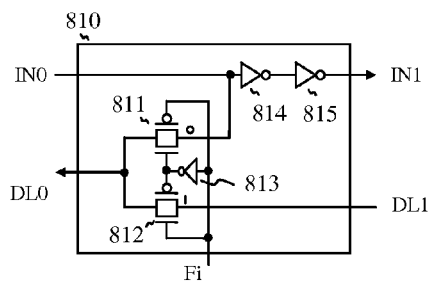
FIG. 8B illustrates a delay unit of the tunable delay circuit.

In FIG. 8C, a related fuse circuit of the tunable delay circuit as shown in FIG. 8A is illustrated, wherein a fuse 821 is connected to a latch node 822, a cross coupled latch including two inverters 825 and 826 are connected to the latch node 822, pull-down transistors 823 and 824 are serially connected to the latch node 822 for power-up reset. Transfer gate 830 is selected by a select signal 829 (high) and another select signal 828 (low) in order to bypass the latch node 822 through inverter 825 and 827. In doing so, fuse data is transferred to output node Fi, otherwise, test input Ti is transferred to Fi when a transmission gate 831 is turned on.

Figure 8D:
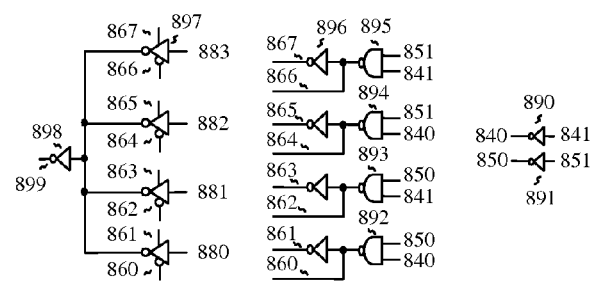
FIG. 8D illustrates a related selector circuit of FIG. 7, according to the teachings of the present invention.

In FIG. 8D, detailed selector circuit as shown 703 and 729 in FIG. 7 is illustrated. In order to select a signal from four data inputs 880, 881, 882, and 883, one of four tri-state inverters are selected, respectively, such that input 880 is transferred to output node 899 through inverter 898 when selector signal 860 is low and another selector signal 861 is high to turn on the related tri-state inverter. In the similar manner, input 881 is transferred to output node 899 through inverter 898 when selector signal 862 is low and another selector signal 863 is high to turn on the related tri-state inverter. Input 882 is transferred to output node 899 through inverter 898 when selector signal 864 is low and another selector signal 865 is high to turn on the related tri-state inverter. And input 883 is transferred to output node 899 through inverter 898 when selector signal 866 is low and another selector signal 867 is high to turn on the related tri-state inverter 897. When a tri-state inverter is selected, the other tri-state inverters are not selected, such that one of four-input-NOR gates 892, 893, 894 and 895 is asserted to low by selector inputs 841 and 851. Selector inputs 841 and 851 are inverted to generate negated outputs 840 and 850 by inverter 890 and 891 respectively, in order to decode the NOR gates 892, 893, 894 and 895, respectively. And inverter 896 and others generate inverting signals 861, 863, 865 and 867 to select the related tri-state inverters to bypass the related data inputs.

Figure 9:
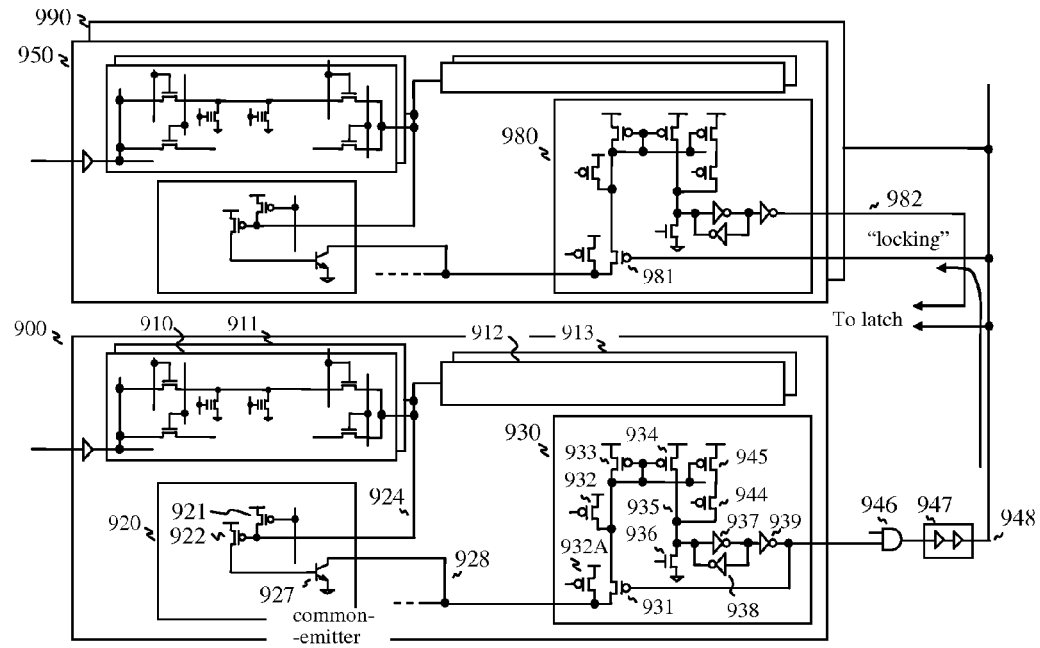
FIG. 9 illustrates alternative configuration including a current mirror as a block read circuit in a memory block, according to the teachings of the present invention.

There are various alternatives and modifications for implementing the memory array, such that a bipolar segment read circuit includes a bipolar transistor, a MOS read transistor and a MOS pre-charge transistor as shown 920 in FIG. 9. Furthermore, the block read circuit 930 includes a current mirror. A memory block 900 includes memory arrays 910, 911, 912 and 913, a write buffer 901, the bipolar segment read circuit 920, and the block read circuit 930. The bipolar segment read circuit 920 is connected to memory cell arrays 910, 911, 912 and 913, which arrays are the same circuit as shown 201 in FIG. 2, which circuit 920 includes a MOS pre-charge transistor 921, a MOS read transistor 922 and a bipolar transistor 927. The bipolar transistor 927 serves as an amplify device, which device is connected to a pull-up transistor 933 serving as a load device through block read line 928, such that an amplifier is composed of the amplify device and load device. The block read circuit 930 is composed of a current mirror circuit and a latch circuit, wherein the current mirror is composed of a pull-up transistor 933 and a current mirror (repeater) 934, and the latch circuit is composed of two cross coupled inverters 937 and 938. Additionally, the pull-up strength of the current repeater can be tunable with multiple repeaters including NMOS 945 which is selected by NMOS switch 944, and more current repeaters can be added even though the drawing illustrates only one selectable repeater. The pull-up transistor 933 is connected to the bipolar segment read circuit 920 through the block read line 928 and NMOS switch 931, and pre-charge transistor including 932 and 932A. When low threshold data is read, the bipolar segment read circuit 920 sets up a current path through the pull-up transistor 933 while the switch 931 is turned on and the pre-charge transistors 932 and 932A are turned off. Hence, the latch node 935 is raised to high from the pre-charged voltage (at low), where the pre-charge transistor 936 is turned off during read. By raising the latch node 935, the inverters 937 and 939 are changed, and the logic state is stored in the latch circuit including two cross coupled inverters 937 and 938. And inverter output signal 939 is transferred to OR gate 946. Furthermore, the gate 946 receives multiple signals from other memory block (not shown), so that the signal is generated only if at least one reference cell works correctly, which signal serves as a reference signal. Then a tunable delay circuit 947 adds a delay time for optimizing the reference signal. Thus, the tunable delay circuit output 948 serves as a locking signal to lock the latch circuits 980 in the main memory block 950 and other memory block 990, where the main memory blocks 950 and 990 include same configuration as the memory block 900, except the stored data in the reference memory block 900 is low threshold data to generate the reference signal. Thus the main memory blocks receive the locking signal 948. In doing so, the output 982 is determined by locking transfer transistor 981 with the locking signal 948. Advantage of using current mirror as a block read circuit is that the current path through the bipolar segment read circuit is short by a direct feedback of the output of the current mirror, which reduces current consumption with short feedback path during read operation. This configuration is more useful where the memory block is relatively small.

Figure 10:
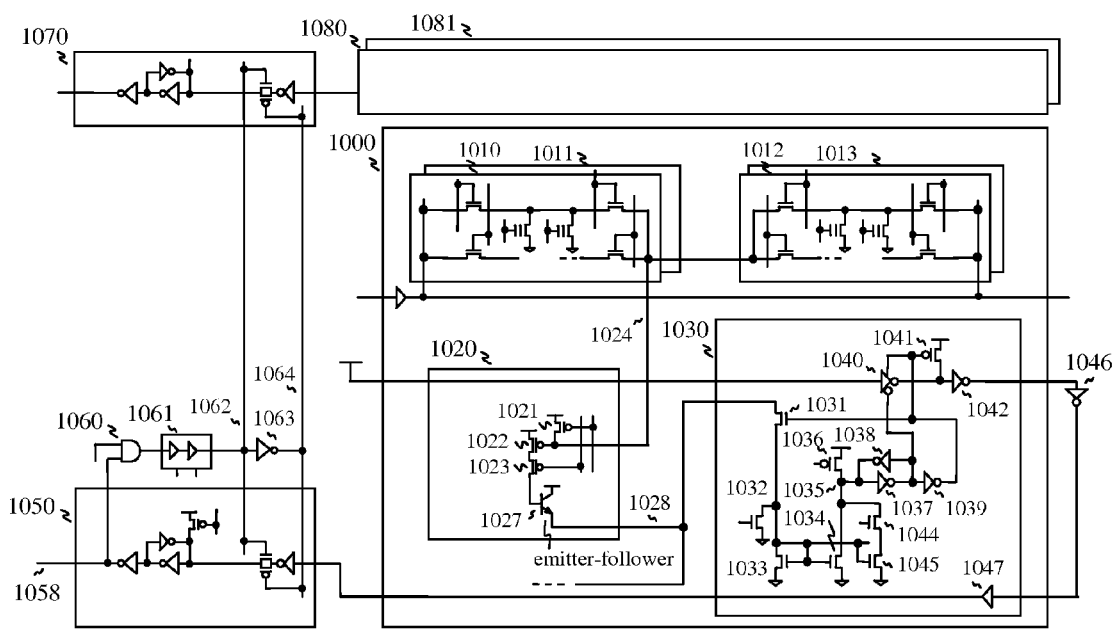
FIG. 10 illustrates alternative configuration including a current mirror as a block read circuit in a memory bank, according to the teachings of the present invention.

In FIG. 10, alternative configuration including an emitter-follower is illustrated. Memory blocks 1000, 1080 and 1081 configure a relatively big memory bank. And more memory blocks can be added for configuring big memory bank even though the drawing illustrates a few memory blocks for simplifying the drawing. The memory block 1000 includes memory arrays 1010, 1011, 1012 and 1013, a bipolar segment read circuit 1020, and a block read circuit 1030. The bipolar segment read circuit 1020 including pre-charge transistor 1021, read transistor 1022, select transistor 1023 and bipolar transistor 1027, is connected to memory cell arrays, which arrays are the same circuit as shown 201 in FIG. 2. In particular, an emitter-follower is composed of the n-p-n bipolar transistor 1027 and pull-down transistor 1033, where feedback transistor 1031 is turned on but pre-charge transistor 1032 is turned off. Furthermore, the block read circuit 1030 is composed of a current mirror circuit and a latch circuit, wherein the current mirror is composed of a pull-down transistor 1033 and a current repeater 1034, and the latch circuit is composed of two cross coupled inverters 1037 and 1038. Additionally, the pull-down strength of the current repeater can be tunable with multiple repeaters including NMOS 1045 which is selected by NMOS switch 1044. The pull-down transistor 1033 is connected to the bipolar segment read circuit 1020 through the block read line 1028 and the feedback transistor 1031. When low threshold data is read, the bipolar segment read circuit 1020 pulls up the block read line 1028 while the feedback transistor 1031 is turned on and the pre-charge transistor 1032 is turned off. Hence, the latch node 1035 is changed to low from the pre-charged voltage, where the pre-charge transistor 1036 is turned off during read. By lowering the latch node 1035, the inverters 1037 and 1039 are changed, and the logic state is stored in the cross coupled inverters 1037 and 1038. Then the latched (high) data in the inverter 1037 disables a tri-state inverter 1040 and the latched (low) data in the inverter 1039 turns on PMOS 1041. Turning on PMOS 1041, output of inverter 1042 is changed to low from high. And the output is transferred to a latch circuit 1050 through inverting buffer 1046 and non-inverting buffer 1047, which changes latch output 1058 to low. And then, the output 1058 changes AND gate 1060 to low, which signal is transferred to a delay circuit 1061. As a result, a negative locking signal 1062 is generated and a positive locking signal 1064 is inverted by an inverter 1063 to lock latch circuit 1050 and 1070. Advantage of using current mirror as a block read circuit is that the current path through the bipolar segment read circuit is directly cut off by its own feedback of the output of the current mirror, which reduces more current consumption during read operation with very short feedback path.

Figure 11:
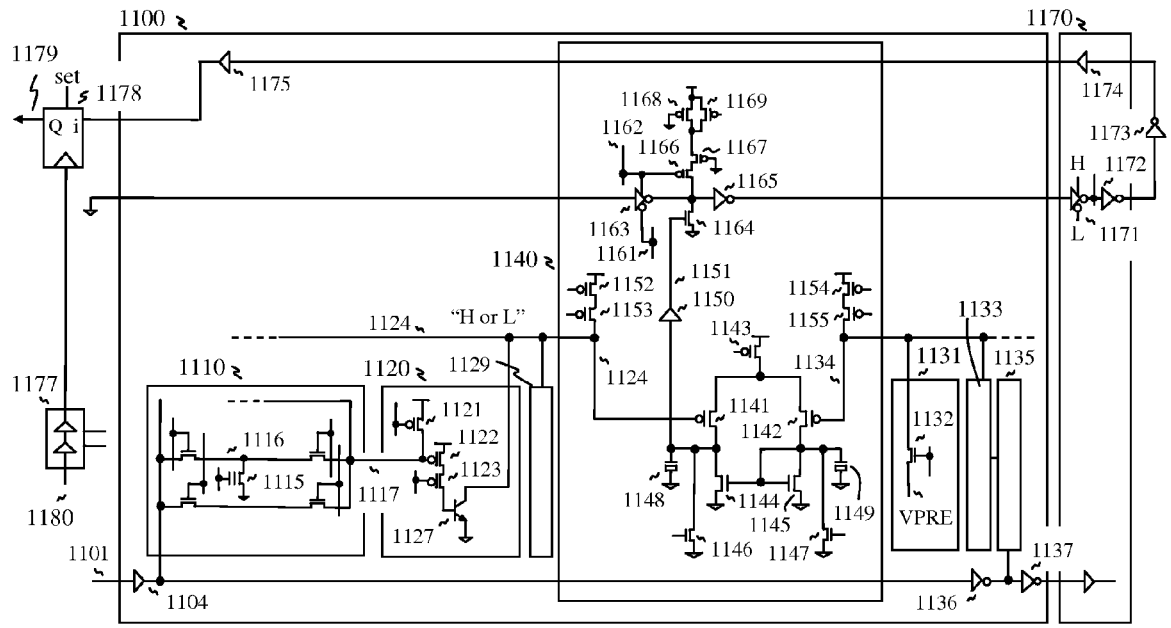
FIG. 11 illustrates alternative configuration including a differential amplifier as a block read circuit in a memory bank, according to the teachings of the present invention.

In FIG. 11, alternative configuration including a differential amplifier as a block read circuit is illustrated, wherein the differential amplifier 1140 serves as a comparator. The comparator 1140 receives a pairs of block read lines 1124 and 1134 from selected memory cell array 1110 and a reference signal generator 1131, respectively. And the bipolar segment read circuit 1120 configures an amplifier with pull-up transistors 1152 and 1153 as active load, for reading the selected memory cell array 1110. Moreover, multiple pull-up transistors can be added for adjusting gain even though the drawing illustrates only one load device including transistors 1152 and 1153 for simplifying the drawing. Thereby the amplifier output 1124 serves as the block read line, which amplifies the voltage of segment read line 1117 which is connected to the selected local bit line 1116. And the local bit line is driven by a selected memory cell 1115. The bipolar segment read circuit 1120 is composed of a pre-charge transistor 1121, a read transistor 1122 and select transistor 1123 to convert bit line voltage to base current of an n-p-n bipolar transistor 1127, so that collector current of the bipolar transistor 1127 strongly pulls down the block read line 1124, when the selected memory cell stores low threshold data. On the contrary, another input 1134 for the comparator 1140 is generated by a reference circuit 1131, which provides VPRE (half VDD) voltage for the comparator, while pull-up transistors 1154 and 1155 are turned off. And unselected memory cell array 1133 and unselected segment read circuit 1135 keep pre-charge state.

In order to read data, a memory cell 1115 is selected in a memory cell array 1110 while the other memory cells are turned off (not shown), so that the segment read line 1117 is lowered through the local bit line 1116 near ground voltage when read data "0" (low threshold data). By lowering the segment read line 1117, the read transistor 1122 is turned on when the column select transistor 1123 is selected, which turns on the bipolar transistor 1127. Thus the block read line 1124 is lowered by the strong bipolar transistor 1127, where active load device 1152 and 1153 are relatively weaker than that of the bipolar transistor 1127, for example, 10 times weaker. After the block read line 1124 is settled down, the differential amplifier is activated by turning enable transistor 1143. Thus the drain node of the receiving transistor 1141 and 1142 start changing, but the decoupling capacitors 1148 and 1149 resist to change the drain nodes, so that the decoupling capacitors effectively suppress abrupt change when activated, which helps to reject coupling noise. The coupling capacitor size can be decided depending on the target speed because big capacitor delays the sensing speed while small capacitor does not help filtering noise. The differential amplifier receives two inputs, so that one input is referred to as a negative input and another input is referred to as a positive input. In order to keep positive polarity, the memory cell array 1110 stores positive data because the read output generates positive data. On the contrary, the memory cell array 1133 stores negative data, which is inverted by inverting buffer 1136. And another inverter 1137 recovers the polarity for next block 1170.

As a result, non-inverting buffer 1150 receives the differential amplifier output, so that the buffer 1150 generates high voltage. Alternatively, the buffer 1150 uses a Schmidt trigger to determine output voltage more effectively. In contrast, when the memory array 1133 in the right side is selected, the reference voltage generator circuit 1129 in the left side is activated to provide VPRE voltage. In this manner, the differential amplifier differentiates data "0" and "1" with the mid level reference voltage, which equally reads the stored data, even though the amplifier and the differential amplifier consume current during read operation.

After the buffer 1150 generates read output 1151, a pull-down transistor 1164 receives the read output 1151 from the differential amplifier, so that an output of an inverter 1165 is changed to high, because the pull-down transistor 1164 is fully turned on when the reading data "0" from the memory cell array 1110, where the strength of pull-up transistors including 1166, 1167, 1168 and 1169 is much weaker than that of the pull-down transistor 1164. Thereby, the pull-down transistor 1164 pulls down its drain only if the buffer output 1151 is high, which configures another amplifier with pull-up transistors. Otherwise, the pull-down transistor 1164 is turned off and the pull-up transistors sustain the input of inverter 1165, and the tri-state inverter 1163 is turned off for the selected block by block select signals 1161 (high) and 1162 (low). In contrast, the tri-state inverter 1171 in the unselected block 1170 is turned on to bypass the read output. Furthermore, the pull-up strength is tunable with selectable PMOS transistor 1169 including wide channel, where more tunable pull-up transistors can be added even though the drawing illustrates only one tunable circuit. In doing so, weak turn-on state of the pull-down 1164 is rejected by the pull-up transistors, such that the differential amplifier output is very slightly raised when the differential amplifier is activated typically, because both amplifier outputs moves toward half VDD voltage thus the drain nodes of the receiving transistors 1141 and 1142 are slightly raised. The tunable pull-up transistors effectively reject the weak turn-on during transition time. And furthermore, the slight change is rejected by the buffer 1150 including a Schmidt trigger as well. When reading data "0" from the memory cell array 1110, the read buffer 1165 transfers the change to the output latch circuit 1178, through read path including tri-state inverter 1171, inverting buffers 1172 and 1173, and non-inverting buffers 1174 and 1175. Then, the read output is stored in the latch circuit 1178, and the latch control circuit 1177 locks the latch circuit 1178, where the latch control circuit 1177 receives a read enable signal 1180 and the read enable signal is delayed by a tunable delay circuit in the latch control circuit 1177.

Figure 12:
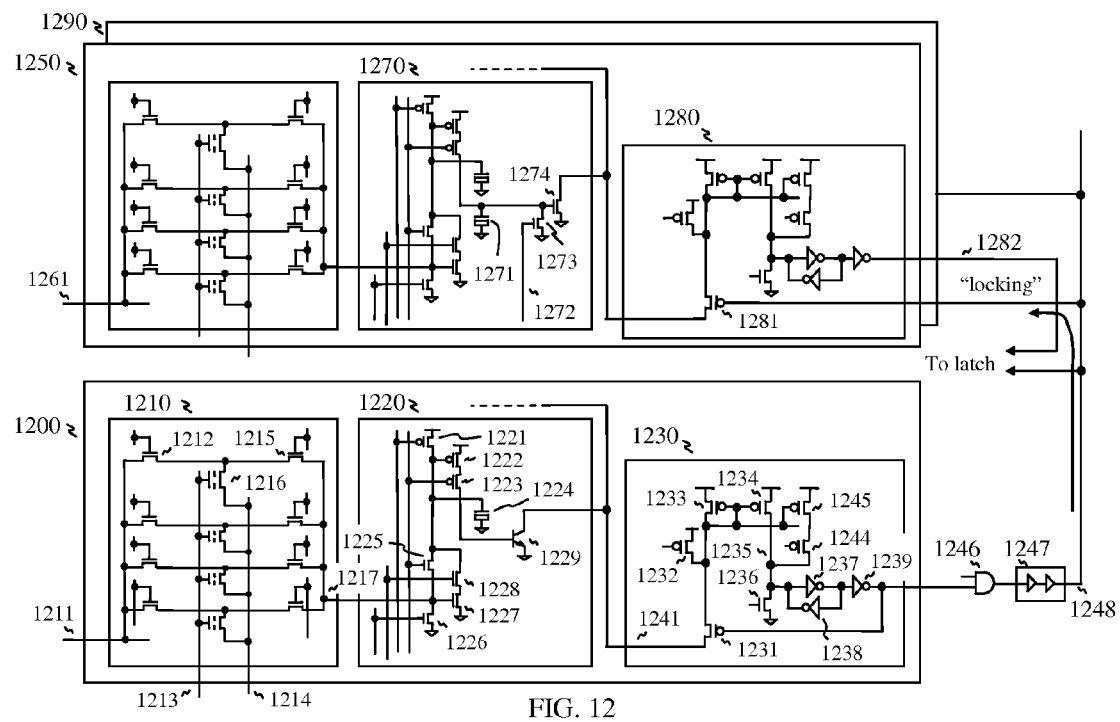
FIG. 12 illustrates an example configuration for reading mirror-bit (dual-bit) memory cell, according to the teachings of the present invention.

In FIG. 12, an example configuration for reading mirror-bit (two-bit) memory cell is illustrated, wherein a memory block 1200 includes memory arrays 1210, a write input signal 1211, a bipolar segment read circuit 1220, and a block read circuit 1230. And each memory cell has two charge storage areas, which cell is referred to as an NROM (nitride, programmable read only memory) cell as published U.S. Pat. No. 6,011,725, No. 6,429,063 and No. 6,649,972. In order to read two data from a memory cell, a pull-up amplifier and a pull-down amplifier are used in the segment read circuit 1220, and then a bipolar transistor 1229 receives current output from one of two amplifiers. More specifically, the pull-up amplifier is composed of a PMOS pre-charge transistor 1221, a PMOS read transistor 1222, and a PMOS select transistor 1223. And NMOS transfer transistor 1225 is turned on when the pull-up amplifier is selected to measure a pull-down path of the selected memory cell with asserting the source line 1214 to low. The pull-down amplifier is composed of an NMOS pre-charge transistor 1226, an NMOS read transistor 1227, and an NMOS select transistor 1228. And NMOS transfer transistor 1225 is turned off when the pull-down amplifier is selected to measure a pull-up path of the selected memory cell with asserting the source line 1214 to high, where a decoupling capacitor 1224 is used for reducing coupling noise.

To read data with the pull-up amplifier, a memory cell 1216 is selected for instance, by asserting a word line 1213 to pre-determined voltage. And the source line 1214 is asserted to ground voltage while a read transfer transistor 1215 is turned on and a write transfer transistor 1212 is turned off. In doing so, the memory cell 1216 discharges the segment read line 1217 when the stored data in the memory cell is low threshold data. Otherwise, the memory cell 1216 does not discharge the segment read line 1217 when the stored data in the memory cell is high threshold data.

When low threshold data is stored in the selected memory cell, the pull-up amplifier provides a base current to the n-p-n bipolar transistor 1229 when the segment read line 1217 is discharged by the selected memory cell through the NMOS transfer transistor 1225, while the PMOS pre-charge transistor 1221, the NMOS pre-charge transistor 1226 and the NMOS select transistor 1228 are turned off, but the PMOS select transistor 1223 is turned on to activate the PMOS read transistor 1222. Hence, the current output of the PMOS transistors 1222 and 1223 is provided to the bipolar transistor 1229, thus the amplified current output is transferred to the block read circuit 1230 through the block read line 1241. In this manner, the bipolar transistor 1229 serves as an amplify device, which device is connected to a pull-up transistor 1233 serving as a load device through block read line 1241 and a feedback transistor 1231, so that a common-emitter amplifier is composed of the amplify device and the load device. Furthermore, the block read circuit 1230 comprises a current mirror circuit and a latch circuit, wherein the current mirror is composed of a pull-up transistor 1233 and a current mirror (repeater) 1234, and the latch circuit is composed of two cross coupled inverters 1237 and 1238. Additionally, the pull-up strength of the current repeater can be tunable with multiple repeaters including PMOS 1245 which is selected by PMOS switch 1244, and more current repeaters can be added even though the drawing illustrates only one selectable repeater. The pull-up transistor 1233 is connected to the bipolar segment read circuit 1220 through the block read line 1241 and PMOS switch 1231, and a pre-charge transistor 1232. When low threshold data is read, the bipolar segment read circuit 1220 sets up a current path through the pull-up transistor 1233 while the switch 1231 is turned on and the pre-charge transistor 1232 is turned off. Hence, the latch node 1235 is raised to high from the pre-charged voltage (at low), where the pre-charge transistor 1236 is turned off during read. By raising the latch node 1235, the inverters 1237 and 1239 are changed, and the logic state is stored in the latch circuit including two cross coupled inverters 1237 and 1238. And inverter output signal 1239 is transferred to AND gate 1246. Furthermore, the gate 1246 receives multiple signals from other memory block (not shown), so that the signal is generated only if at least one reference cell works correctly, which signal serves as a reference signal. Then a tunable delay circuit 1247 adds a delay time for optimizing the reference signal. Thus, the tunable delay circuit output 1248 serves as a locking signal to lock the latch circuits 1280 in the main memory block 1250 and other memory block 1290, where the main memory blocks 1250 and 1290 include same configuration as the memory block 1200, except the stored data in the reference memory block 1200 is low threshold data to generate the reference signal. Thus the main memory blocks receive the locking signal 1248. In doing so, the output 1282 is determined by locking transfer transistor 1281 with the locking signal 1248.

Alternatively, the amplify transistor can be a MOS transistor as shown in the segment read circuit 1270 to amplify the received voltage output from the amplifier, such that the amplify transistor 1274 receives voltage output from one of amplifiers. The decoupling capacitor 1271 is used to precharge the input of the amplify transistor 1774 by a pre-charge transistor 1273 with a pre-charge control signal 1272, before the pull-up amplifier or the pull-down amplifier are activated. Using MOS amplify transistor, the gain is slightly reduced, but the circuit equally works to read the stored data in the memory cell. Heading Methods of Fabrication The cell transistors can be formed from single crystal silicon on the surface of the wafer. And the steps in the process flow should be compatible with the current CMOS manufacturing environment as published as the prior arts, such as U.S. Pat. No. 6,197,639, No. 6,424,001 and No. 7,253,046 to form the NOR flash memory cell. Alternatively, the cell transistors can be formed from thin-film polysilicon layer within the current CMOS process environment, in order to reduce chip area. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel, according to the prior arts. Now the LTPS can be used as a thin film transistor for the flash memory. The thin film based cell transistor can drive multi-divided bit line which is lightly loaded, even though thin film polysilicon transistor can flow less current than single crystal silicon based transistor on the surface of the wafer. During LTPS process, the MOS transistor in the control circuit and routing metal are not degraded. And the steps in the process flow should be compatible with the current CMOS manufacturing environment. In this respect, detailed manufacturing processes for forming the memory cell, such as width, length, thickness, temperature, forming method, or any other material related data, are not described in the present invention.

Referring now to FIGS. 13A, 13B, 13C and 13D, example layouts for the memory cell array and the segment read circuit are illustrated. In order to fabricate within the conventional planar CMOS process environment, one segment read circuit is matched with two memory arrays, wherein the base layers including p+ active region, n+ active region, poly gate region and contact region are shown in FIG. 13A. More specifically, write select transistors are controlled by poly gates 1301 and 1302, the memory cells are controlled by poly gates 1303, 1304, 1305 and 1306, and the read select transistors are controlled by poly gates 1307 and 1308. The bipolar segment read circuit 1320 is configured, such that poly gate 1321 configures pre-charge transistor which circuit is shown 1021 in FIG. 10, poly gate 1322 configures segment read transistor which circuit is shown 1022 in FIG. 10, poly gate 1323 configures select transistor which circuit is shown 1023 in FIG. 10, and n+ region 1327 is deposited on the drain region of the select transistor 1323 to form a bipolar transistor 1027 in FIG. 10, so that an emitter-follower is composed of load device in the block read circuit. Furthermore, multiple cell transistors can be added in the memory cell array even though the drawing includes only eight cell transistors for simplifying the drawing. In FIG. 13B, metal-1 and via-1 region are added, and in FIG. 13C metal-2 and via-2 region are added, where two segment read circuits are shown in order to illustrate the repeatability such that the segment read transistor 1322 is placed in zigzag array because the pitch is limited. In FIG. 13D, metal-3 is added, wherein segment write line SWL is attached to the via-2 region and segment read line SRL is attached to the related via-2 region. The segment read line SRL transfers the local bit line voltage, and then SRL line is ended. Thus block read line BRL is connected to the n+emitter region 1327, and BRL line connected to upper metal layer, for example, metal-4 (not shown).

Referring now to FIG. 14A, a related circuit schematic to explain a cross sectional view for the memory array and the bipolar segment read circuit, wherein the memory cells 1402, 1403 and 1404 are connected the local bit line 1416, and the write transfer transistor 1401 and the read transfer transistor 1406 are connected to the local bit line 1416. The segment read line 1424 is connected to the read transfer transistor 1406 and the segment pre-charge transistor 1421, the segment read transistor 1422 receives local bit line voltage through the segment read line 1424, the segment select transistor 1423 is serially connected to the segment read transistor 1422, and drain region 1426 of the segment select transistor serves as a base of an n-p-n bipolar transistor 1427. The block read line 1431 is connected to an emitter of an n-p-n bipolar transistor 1427. A collector of the n-p-n bipolar transistor 1427 is shared with n-well 1428. Detailed structure will be shown in FIG. 14B.

Referring now to FIG. 14B in view of FIG. 14A, a cross sectional view for the memory cell array 1400 and the bipolar segment read circuit 1420 is illustrated as an example implementation, wherein the memory cells are formed on the bulk 1429, the segment read circuit 1420 is formed on the n-well 1428, thus the bipolar segment read circuit is placed next to the memory cells on the planar structure, which can be fabricated in the conventional CMOS process environment. In the memory cell array 1400, the poly gate 1401 serves as the write select transistor and the poly gate 1406 serves as the read select transistor. The memory cells 1402, 1403 and 1404 are placed in the middle region of the select (transfer) transistors 1401 and 1406. In the bipolar segment read circuit 1420, transistor 1421 serves as the segment pre-charge transistor, transistor 1422 serves as the segment read transistor, transistor 1423 serves the segment select transistor, and the n-p-n bipolar transistor 1427 serves as an amplify device of the emitter-follower. The emitter region 1427 is formed on the drain region 1426 of the segment select transistor which serves as a base of an n-p-n bipolar transistor 1427. A collector of the n-p-n bipolar transistor 1427 is shared with n-well 1428. Thereby, the emitter-follower is formed by adding only n+ emitter region, where the n+ emitter region can be polysilicon. Alternatively, the n+ emitter region can be metal in order to form a Schottky barrier, which equally works as an n-p-n bipolar transistor. Furthermore, Schottky barrier is lower than any other p-n junction, such that built-n voltage of Schottky barrier is 0.15~0.45V, while that of silicon p-n junction is around 0.7V. Hence, the emitter-follower has more gain with Schottky barrier. The metal-3 (block read line) 1431 is formed on the metal-2 line which is the segment read line 1424, and the block read line 1431 is connected to the emitter region 1427. And the segment read line 1424 is connected to the gate of the segment read transistor 1422 through metal-1 and contact region (not shown). The transistors are isolated by STI (Shallow Trench Isolation) region 1432.

In FIGS. 15A to 15C, another example layout for the bipolar segment read circuit is illustrated. The segment read circuit includes poly gate 1521 as a pre-charge transistor, poly gate 1522 as a read transistor and poly gate 1523 as a column select transistor on the active region 1511. And bipolar amplify transistor is composed of n-type emitter 1529A, p-type base 1526 and n-type collector 1527, as shown in FIG. 15A. Thereby, the bipolar transistor configures a common-emitter amplifier, which configuration is same circuit as shown 220 in FIG. 2. And metal-1 layer is connected to active region 1511 and poly gate region, as shown in FIG. 15B. And in FIG. 15C, metal-2 layer 1526A is formed on the metal-1 layer, thus the base 1526 is connected to drain of the select transistor 1523 through the metal-2 layer. The emitter 1529A is connected to metal-3 layer 1529, which provides ground voltage. The collector 1527 is connected to metal-3 layer 1527A through metal-2 layer, as shown in FIG. 15C. And more detailed connection with cross sectional view is shown in FIG. 15D, wherein the ground line 1529 passes under the memory cells, but the ground line 1529 is connected to the emitter 1529A through metal-2 layer even though the connections are not shown in the cross sectional view. The base connection 1526A is shown to connect the base region 1526, and the collector region 1527 is shown to connect the block read line 1533. The segment read transistor 1522 and the segment select transistor 1523 are formed on the n-well 1598 which is formed on the substrate 1599. The memory cell array is formed from polysilicon layer, such as LTPS (Low Temperature Polycrystalline Silicon) layer, wherein the memory cells 1573 and 1574 are formed on metal line 1564 which serves as body bias voltage. The charge trap region is formed in between the poly gate 1573 and body region 1561. The body region 1561 is connected to the body bias voltage through poly plug 1562 and ohmic contact region 1563 to reduce contact resistance. The write transfer transistor 1572 is connected to the memory cell 1573, and the read transfer transistor 1575 is connected to the memory cell 1574. And more memory cells can be connected even though the drawing illustrates two memory cells only for simplifying the drawing.

In FIG. 16, a cross sectional view for the multi-stacked memory cell array is illustrated, wherein the memory cell array 1630 is formed on another memory cell array 1620, and the control circuit is formed on the surface of the wafer. Each memory cell array has the same structure as shown in FIG. 15D. And the control circuit can be formed on the buried oxide layer 1698 of the SOI (Silicon on Insulator) wafer 1699, alternatively. Transistors on the SOI wafer is typically fast, and which consumes less current, but slightly expensive in manufacturing cost.

Furthermore, the charge trap regions 1631 can be formed from various materials, such as polysilicon layer to form a flash memory, nitride layer to form an MNOS (metal-nitride-oxide semiconductor) memory and a SONOS (silicon-oxide-nitride-oxide semiconductor) memory, alumina to form a MAOS (metal-alumina-oxide-semiconductor) and a MAS (metal-alumina-semiconductor), nanocrystal layer to form a nanocrystal memory as published, U.S. Pat. No. 6,690,059. In particular, quantum dot can be used to form a single electron memory, such that one or two charge trap regions can be used to store charge as published, U.S. Pat. No. 5,960,266 and No. 7,105,874.

CONCLUSION

High speed and high density NOR flash memory is realized, wherein time-domain sensing scheme effectively differentiates the low threshold data and the high threshold data with discharge time based on the cell current, because the cell current is converted to voltage difference by the bipolar segment read circuit and the voltage difference is converted to time difference by the block read circuit, such that an amplifier is composed of the bipolar segment read circuit as an amplify device and the block read circuit as load device in order to amplify the cell current. Thus, reference signal is generated by reference cells storing low threshold data, which is used to generate locking signal with tunable delay circuit to optimize delay time. The locking signal rejects high threshold data. Furthermore, the local bit line is lightly loaded by introducing multi-divided bit line architecture, which achieves fast access with fast discharge time. And the read circuits have no phase control signals, which does not require complex timing generator. And the read circuits achieve fast access time as well. Moreover, by adopting multi-divided bit line, the bit line loading is reduced, which enables to use thin film transistor as a cell transistor. And the thin film cell transistor can be stacked over the peripheral circuit. As a result, the present invention can overcome the scaling limit of the conventional planar CMOS process with multi-stacked memory cell structure. There are no limits to stack multiple memory cells as long as the flatness is good enough to accumulate the transistors.

While the description here has been given for configuring the memory circuit and structure, alternative embodiments would work equally well with reverse connection, such that p-channel NOR flash memory cell can be used, as published in U.S. Pat. No. 5,818,761. Thus, the memory cell configuration is also reversed, wherein the floating gate storage device includes p-type source and drain with n-type body. And also, the control signal polarities are reversed in order to control the reversely configured memory cell.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
   a memory cell, wherein a floating gate MOS transistor serves as a storage device storing low threshold data or high threshold data in a charge trap region between a body and a control gate; and
   a memory cell array, wherein a plurality of memory cell is connected to a local bit line, one side of the local bit line is connected to a segment write line through a write select transistor and the other side of the local bit line is connected to a segment read line through a read select transistor; and
   a segment write buffer driving the segment write line; and
   a bipolar segment read circuit, wherein drain of a precharge transistor is connected to the segment read line of the bipolar segment read circuit, gate of a read transistor is connected to the segment read line of the memory cell array, a select transistor is connected to the read transistor serially, and base of a bipolar transistor is connected to drain of the select transistor, where the bipolar transistor generates a current output; and
   a block read circuit, wherein a load transistor is connected to the bipolar transistor of the bipolar segment read circuit to receive the current output via transfer transistors, input node of a read inverter is connected to output node of the load transistor, and output node of a tri-state inverter is connected to input node of the read inverter, which read inverter generates a voltage output; and
   a latch circuit storing the voltage output of the block read circuit through a read path; and a latch control circuit, wherein a delay circuit generates a locking signal based on a reference signal which is generated by the memory cells storing low threshold data, and the locking signal locks the latch circuit.

2. The memory device of claim 1, wherein the segment write buffer includes at least a level shifter circuit.

3. The memory device of claim 1, wherein the bipolar segment read circuit includes a pre-charge transistor, a read transistor and a bipolar transistor, such that drain of the pre-charge transistor is connected to the segment read line, gate of the read transistor is connected to the segment read line, and base of the bipolar transistor is connected to drain of the read transistor, where the bipolar transistor generates a current output.

4. The memory device of claim 1, wherein the bipolar segment read circuit includes a pull-up amplifier and a pull-down amplifier for reading NROM (nitride, programmable read only memory) based memory cell where the amplifiers receive voltage output of a selected bit line; and an amplify transistor receives output of the pull-up amplifier and output of pull-down amplifier; and the amplify transistor generates a current output; and the floating gate MOS transistor of the memory cell includes two charge trap regions between a body and a control gate.

5. The memory device of claim 1, wherein the block read circuit includes a load transistor, which transistor serves as an active load to configure an amplifier with the bipolar transistor of the bipolar segment read circuit as an amplify transistor, such that the load transistor is connected to the bipolar transistor of the bipolar segment read circuit through transfer transistors; and a read inverter receives an output of the amplifier, and output of a tri-state inverter is connected to input of the read inverter, the tri-state inverter is controlled by a block select signal, and the read inverter generates a voltage output.

6. The memory device of claim 1, wherein the block read circuit includes tunable load transistors, which transistors serve as an active loads to configure an amplifier with the bipolar transistor of the bipolar segment read circuit as an amplify transistor, such that the load transistors are connected to the bipolar transistor of the bipolar segment read circuit through transfer transistors; and a read inverter receives an output of the amplifier, and output of a tri-state inverter is connected to input of the read inverter, the tri-state inverter is controlled by a block select signal, and the read inverter generates a voltage output; and tuning information for the tunable load transistors is stored in nonvolatile memory.

7. The memory device of claim 1, wherein the block read circuit includes a load transistor, which transistor serves as an active load to configure an amplifier with the bipolar transistor of the bipolar segment read circuit as an amplify transistor, such that the load transistor is connected to the bipolar transistor of the bipolar segment read circuit through a feedback transistor; and gate of a current mirror is connected to gate of the load transistor, thus the current mirror repeats the amount of the current through the load transistor, the pre-charge transistor pre-charges a drain of the current mirror transistor, a cross coupled inverter latch is connected to the drain of the current mirror, and the output of the cross coupled inverter latch controls the feedback transistor; and the output of the cross coupled inverter latch serves as a voltage output of the block read circuit.

8. The memory device of claim 1, wherein the block read circuit includes a load transistor, which transistor serves as an active load to configure an amplifier with the bipolar transistor of the bipolar segment read circuit as an amplify transistor, such that the load transistor is connected to the bipolar transistor of the bipolar segment read circuit through a feedback transistor; and gate of a current mirror is connected to gate of the load transistor, thus the current mirror repeats the amount of the current through the load transistor, the pre-charge transistor pre-charges a drain of the current mirror transistor, a cross coupled inverter latch is connected to the drain of the current mirror, and the output of the cross coupled inverter latch controls the feedback transistor; and the output of the cross coupled inverter latch serves as a voltage output of the block read circuit; and strength of the current mirror is adjustable with multiple select transistors and multiple current mirror; and tuning information for the current mirror is stored in nonvolatile memory.

9. The memory device of claim 1, wherein the block read circuit includes a differential amplifier, which amplifier receives two signals, such that one signal is provided by an amplifier receiving a stored data of a selected memory cell, and another signal is provided by a reference amplifier generating a reference voltage.

10. The memory device of claim 1, wherein the latch control circuit includes a delay circuit, the delay circuit generates a locking signal based on a reference signal which is generated by the memory cells storing low threshold data, and the locking signal locks the latch circuits before receiving read output which is generated by main memory cells storing high threshold data.

11. The memory device of claim 1, wherein the latch control circuit includes a delay circuit, the delay circuit generates a locking signal based on a reference signal which is generated by the memory cells storing low threshold data, and the locking signal locks the latch circuits before receiving read output which is generated by main memory cells storing high threshold data, and the delay circuit is tunable; and tuning information for the delay circuit is stored in nonvolatile memory.

12. The memory device of claim 1, wherein the latch control circuit receives a selected reference signal, which signal is selected from one of multiple reference signals which are generated by multiple pairs of reference memory cells in order to differentiate multi-level threshold data in the memory cell, wherein the first reference signal is generated from the first pair of the reference memory cells when one reference memory cell stores the first threshold data and another reference memory cell stores the second threshold data when read, the second reference signal is generated from the second pair of the reference memory cells when one reference memory cell stores the second threshold data and another reference memory cell stores the third threshold data, in this manner more reference signals are generated for measuring more levels of threshold data.

13. The memory device of claim 1, wherein the latch circuit stores the voltage output of the block read circuit through a read path, which read path includes a returning path from end of the memory cell array.

14. The memory device of claim 1, wherein the latch circuit stores the voltage output of the block read circuit through a read path, which path includes an inverting returning path.

15. The memory device of claim 1, wherein the floating gate MOS transistor of the memory cell stores multi-level (multi-threshold) data in the charge trap region.

16. The memory device of claim 1, wherein the floating gate MOS transistor of the memory cell includes a charge trap region which includes polysilicon layer to form a flash memory, nitride layer to form an MNOS (metal-nitride-oxide semiconductor) memory and a SONOS (silicon-oxide-nitride-oxide semiconductor) memory, and alumina to form a MAOS (metal-alumina-oxide-semiconductor) and a MAS (metal-alumina-semiconductor).

17. The memory device of claim 1, wherein the floating gate MOS transistor of the memory cell includes a charge trap region which includes nanocrystal layer to form nanocrystal memory, and quantum dot to form a single electron memory.

18. The memory device of claim 1, wherein the floating gate MOS transistor of the memory cell includes n-channel MOS field effect transistor or p-channel MOS field effect transistor.

19. The memory device of claim 1, wherein the floating gate MOS transistor of the memory cell is formed on the peripheral circuits.

20. The memory device of claim 1, wherein the floating gate MOS transistor of the memory cell is stacked over another floating gate MOS transistor.

* * * * *